(12) United States Patent
Shedletsky et al.

(10) Patent No.: US 12,150,339 B2
(45) Date of Patent: *Nov. 19, 2024

(54) ELECTRONIC DEVICES WITH LIGHT SENSORS AND DISPLAYS

(71) Applicant: Apple Inc., Cupertino, CA (US)

(72) Inventors: Anna-Katrina Shedletsky, Mountain View, CA (US); Paul S. Drzaic, Morgan Hill, CA (US); Erik G. de Jong, San Francisco, CA (US); Fletcher R. Rothkopf, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/474,118

(22) Filed: Sep. 25, 2023

(65) Prior Publication Data

US 2024/0015999 A1 Jan. 11, 2024

Related U.S. Application Data

(63) Continuation of application No. 17/357,831, filed on Jun. 24, 2021, now Pat. No. 11,800,746, which is a
(Continued)

(51) Int. Cl.
*H10K 50/86* (2023.01)
*G02F 1/133* (2006.01)
(Continued)

(52) U.S. Cl.
CPC ......... *H10K 50/865* (2023.02); *G06F 1/1637* (2013.01); *H10K 50/11* (2023.02);
(Continued)

(58) Field of Classification Search
CPC .... H10K 50/865; H10K 50/11; H10K 50/818; H10K 50/828; H10K 50/844;
(Continued)

(56) References Cited

U.S. PATENT DOCUMENTS

| 5,705,285 A | 1/1998 | Shi et al. |
| 6,061,463 A | 5/2000 | Metz et al. |

(Continued)

FOREIGN PATENT DOCUMENTS

| EP | 1335430 A1 | 8/2003 |
| EP | 2144293 B1 | 1/2010 |

(Continued)

OTHER PUBLICATIONS

US 4,379,180 A, 04/1983, Baglin et al. (withdrawn)

*Primary Examiner* — Seung C Sohn
(74) *Attorney, Agent, or Firm* — Treyz Law Group, P.C.; Kendall P. Woodruff

(57) ABSTRACT

An electronic device is provided with a display and a light sensor that receives light that passes through the display. The display includes features that increase the amount of light that passes through the display. The features may be translucency enhancement features that allow light to pass directly through the display onto a light sensor mounted behind the display or may include a light-guiding layer that guides light through the display onto a light sensor mounted along an edge of the display. The translucency enhancement features may be formed in a reflector layer or an electrode layer for the display. The translucency enhancement features may include microperforations in a reflector layer of the display, a light-filtering reflector layer of the display, or a reflector layer of the display that passes a portion of the light and reflects an additional portion of the light.

20 Claims, 16 Drawing Sheets

Related U.S. Application Data continuation of application No. 16/599,039, filed on Oct. 10, 2019, now Pat. No. 11,050,044, which is a continuation of application No. 15/891,232, filed on Feb. 7, 2018, now Pat. No. 10,446,800, which is a continuation of application No. 15/483,895, filed on Apr. 10, 2017, now Pat. No. 9,947,901, which is a continuation of application No. 15/087,835, filed on Mar. 31, 2016, now Pat. No. 9,620,571, which is a continuation of application No. 13/732,966, filed on Jan. 2, 2013, now Pat. No. 9,310,843.

(51) Int. Cl.

| | | |
|---|---|---|
| *G06F 1/16* | (2006.01) | |
| *H10K 50/11* | (2023.01) | |
| *H10K 50/818* | (2023.01) | |
| *H10K 50/828* | (2023.01) | |
| *H10K 50/844* | (2023.01) | |
| *H10K 50/856* | (2023.01) | |
| *H10K 59/13* | (2023.01) | |
| *H10K 59/60* | (2023.01) | |
| *H10K 102/00* | (2023.01) | |

(52) U.S. Cl.
CPC ......... *H10K 50/818* (2023.02); *H10K 50/828* (2023.02); *H10K 50/844* (2023.02); *H10K 50/856* (2023.02); *H10K 50/86* (2023.02); *H10K 59/13* (2023.02); *H10K 59/60* (2023.02); *G02F 1/13312* (2021.01); *G02F 1/13318* (2013.01); *H10K 2102/3026* (2023.02)

(58) Field of Classification Search
CPC ...... H10K 50/856; H10K 50/86; H10K 59/13; H10K 59/60; H10K 2102/3026; H10K 59/80518; H10K 59/80524; H10K 59/873; H10K 59/878; H10K 59/8791; G06F 1/1637; G02F 1/13312; G02F 1/13318

See application file for complete search history.

(56) References Cited

U.S. PATENT DOCUMENTS

| | | | |
|---|---|---|---|
| 6,075,316 A | 6/2000 | Shi et al. | |
| 6,339,429 B1 | 1/2002 | Schug | |
| 6,459,436 B1 | 10/2002 | Kumada | |
| 6,537,688 B2 | 3/2003 | Silvernail et al. | |
| 7,025,647 B2 | 4/2006 | Miyazawa | |
| 7,164,961 B2 | 1/2007 | Mei et al. | |
| 7,382,890 B2 | 6/2008 | Saiki et al. | |
| 7,450,105 B2 | 11/2008 | Nakamura et al. | |
| 7,460,196 B2 | 12/2008 | Kim | |
| 7,468,721 B2 | 12/2008 | Nakano | |
| 7,609,310 B2 | 10/2009 | Miyagawa | |
| 7,804,493 B2 | 9/2010 | Gettemy | |
| 7,825,891 B2 | 11/2010 | Yao et al. | |
| 7,960,682 B2 | 6/2011 | Gardner, Jr. | |
| 8,194,031 B2 | 6/2012 | Yao et al. | |
| 8,330,909 B2 | 12/2012 | Yoshida et al. | |
| 8,361,818 B2 | 1/2013 | Cho et al. | |
| 8,384,003 B2 | 2/2013 | Gardner, Jr. | |
| 8,701,997 B2 | 4/2014 | Dorsey et al. | |
| 8,724,304 B2 | 5/2014 | Raff et al. | |
| 8,867,015 B2 | 10/2014 | Posner et al. | |
| 8,947,627 B2 | 2/2015 | Rappoport et al. | |
| 8,987,652 B2 | 3/2015 | Zheng et al. | |
| 9,024,530 B2 | 5/2015 | Land et al. | |
| 9,028,718 B2 | 5/2015 | Kijima et al. | |
| 9,129,548 B2 | 5/2015 | Zheng et al. | |
| 9,070,648 B2 | 6/2015 | Jong et al. | |
| 9,140,927 B2 | 9/2015 | Memering et al. | |
| 9,245,934 B2 | 1/2016 | Chung et al. | |
| 9,310,843 B2* | 4/2016 | Shedletsky | H10K 50/828 |
| 9,466,653 B2 | 10/2016 | Jong et al. | |
| 9,531,970 B2 | 12/2016 | Haji-Khamneh et al. | |
| 9,543,364 B2 | 1/2017 | Rappoport et al. | |
| 9,825,103 B2 | 1/2017 | Rappoport et al. | |
| 9,578,763 B1 | 2/2017 | Wade | |
| 10,713,998 B2 | 7/2020 | Lynch et al. | |
| 2002/0079512 A1 | 6/2002 | Yamazaki et al. | |
| 2003/0174870 A1 | 9/2003 | Kim et al. | |
| 2003/0189211 A1 | 10/2003 | Deitz | |
| 2003/0189586 A1 | 10/2003 | Vronay | |
| 2004/0036820 A1 | 2/2004 | Runolinna | |
| 2004/0095402 A1 | 5/2004 | Nakano | |
| 2004/0140762 A1 | 7/2004 | Tohma et al. | |
| 2005/0056842 A1 | 3/2005 | Nashi et al. | |
| 2005/0199876 A1 | 9/2005 | Matsumoto | |
| 2005/0219197 A1 | 10/2005 | Pasqualini et al. | |
| 2006/0033016 A1 | 2/2006 | Ogawa et al. | |
| 2006/0049533 A1 | 3/2006 | Kamoshita | |
| 2006/0238517 A1 | 10/2006 | King et al. | |
| 2006/0267625 A1 | 11/2006 | Kaneko | |
| 2007/0236485 A1 | 10/2007 | Trepte | |
| 2007/0257254 A1 | 11/2007 | Yang et al. | |
| 2008/0158173 A1 | 7/2008 | Hamblin et al. | |
| 2008/0273014 A1 | 11/2008 | Lowles et al. | |
| 2008/0284716 A1 | 11/2008 | Edwards | |
| 2009/0002341 A1 | 1/2009 | Saito et al. | |
| 2009/0153438 A1 | 6/2009 | Miller et al. | |
| 2010/0079426 A1 | 4/2010 | Pance et al. | |
| 2010/0115407 A1 | 5/2010 | Kim et al. | |
| 2010/0148163 A1 | 6/2010 | Im et al. | |
| 2010/0165267 A1 | 7/2010 | Yoshida et al. | |
| 2010/0177046 A1 | 7/2010 | Shin et al. | |
| 2010/0273530 A1 | 10/2010 | Jarvis et al. | |
| 2010/0302196 A1 | 12/2010 | Han et al. | |
| 2011/0122560 A1 | 5/2011 | Andre et al. | |
| 2011/0195758 A1 | 8/2011 | Damale et al. | |
| 2011/0210825 A1 | 9/2011 | Murakami et al. | |
| 2011/0220922 A1 | 9/2011 | Kim et al. | |
| 2011/0227873 A1 | 9/2011 | Chung et al. | |
| 2011/0234538 A1 | 9/2011 | Chen et al. | |
| 2011/0248961 A1 | 10/2011 | Svajda et al. | |
| 2012/0043894 A1 | 2/2012 | Koh | |
| 2012/0153153 A1 | 6/2012 | Change et al. | |
| 2012/0176298 A1 | 7/2012 | Suh et al. | |
| 2012/0194441 A1 | 8/2012 | Frey | |
| 2012/0218239 A1 | 8/2012 | Yao et al. | |
| 2012/0267611 A1 | 10/2012 | Chung et al. | |
| 2013/0002731 A1 | 1/2013 | Tam | |
| 2013/0076712 A1 | 3/2013 | Zheng et al. | |
| 2013/0106813 A1 | 5/2013 | Hotelling et al. | |
| 2013/0161489 A1 | 6/2013 | Gardner | |
| 2014/0085265 A1 | 3/2014 | Yin | |
| 2016/0307542 A1 | 10/2016 | Zheng et al. | |
| 2021/0091146 A1 | 3/2021 | Rappoport et al. | |

FOREIGN PATENT DOCUMENTS

| | | |
|---|---|---|
| EP | 2432196 B1 | 3/2012 |
| TW | 201237962 A | 9/2012 |
| WO | 2000/41378 A1 | 7/2000 |
| WO | 2002/37454 A2 | 5/2002 |
| WO | 2007/069107 A2 | 6/2007 |

\* cited by examiner

ELECTRONIC DEVICES WITH LIGHT SENSORS AND DISPLAYS

This application is a continuation of U.S. patent application Ser. No. 17/357,831, filed Jun. 24, 2021, which is a continuation of U.S. patent application Ser. No. 16/599,039, filed Oct. 10, 2019, now U.S. Pat. No. 11,050,044, which is a continuation of U.S. patent application Ser. No. 15/891,232, filed Feb. 7, 2018, now U.S. Pat. No. 10,446,800, which is a continuation of U.S. patent application Ser. No. 15/483,895, filed Apr. 10, 2017, now U.S. Pat. No. 9,947,901, which is a continuation of U.S. patent application Ser. No. 15/087,835, filed Mar. 31, 2016, now U.S. Pat. No. 9,620,571, which is a continuation of U.S. patent application Ser. No. 13/732,966, filed Jan. 2, 2013, now U.S. Pat. No. 9,310,843, all of which are hereby incorporated by reference herein in their entireties.

BACKGROUND

This relates generally to electronic devices and, more particularly, to electronic devices with displays and light sensors.

Electronic devices often include displays. For example, cellular telephones and portable computers often include displays for presenting information to a user.

Electronic devices also often include light sensors. For example, an electronic device may include an ambient light sensor that senses the amount of light in the environment surrounding the device. The brightness of display images generated by the display is sometimes adjusted based on the amount of ambient light. For example, in bright sunlight, the display brightness may be increased and in a dark room, the display brightness can be decreased.

In a typical device, the display emits display light from a first side and has an opposing side that is opaque or reflective for preventing light from leaking into the device. These opaque display structures also block light that originates outside of the device such as ambient light from passing through the display. Additional space is therefore commonly provided within a device enclosure to accommodate a light sensor that receives light through a transparent portion of the enclosure.

This type of additional space for a common display and light sensor package can result in an undesirable increase in the size and thickness of the device.

It would therefore be desirable to be able to provide improved displays for electronic devices with light sensors and displays.

SUMMARY

An electronic device is provided with a display mounted in an electronic device housing. The electronic device is also provided with one or more light sensors that receive light through at least a portion of the display.

The light sensor may be implemented as an ambient light sensor, a proximity sensor, ultraviolet light sensor, infrared light sensor, thin-film solar cell, a photoplethysmograph, or other light sensor.

The display includes translucency enhancement features and/or light-guiding features that allow light that originates outside the device to pass through the display onto the light sensor.

The display may be an organic light-emitting diode display, a liquid crystal display or a display that incorporates other types of display pixel technology.

The translucency enhancement features may include a translucent reflective layer that reflects display light generated by the display while passing at least some ambient light, microperforations in one or more display layers that allow ambient light to pass through the display layers, modified display traces that allow light to pass onto the light sensor or other suitable translucency enhancement features that increase the transparency of the display in comparison with conventional displays.

The light-guiding features may include a light-guiding layer in the display that guides light to a light sensor that is mounted along an edge of the light-guiding layer.

The light sensor can be mounted behind the display and configured to receive light through the translucent display or the light sensor can be mounted along an edge of the display and receive light that is guided to the light sensor by the light-guiding layer of the display.

Further features, their nature and various advantages will be more apparent from the accompanying drawings and the following detailed description of the preferred embodiments.

DETAILED DESCRIPTION

Electronic devices are provided with displays and light sensors. The display includes features that allow light to pass through the display onto the one or more light sensors. The features that allow light to pass through the display onto the one or more light sensors may include translucency enhancement features that enhance the translucency of the display and/or light-guiding structures that guide light through the display onto the light sensors. Illustrative electronic devices that have displays and light sensors are shown in FIGS. 1, 2, 3, and 4.

Figure 1:
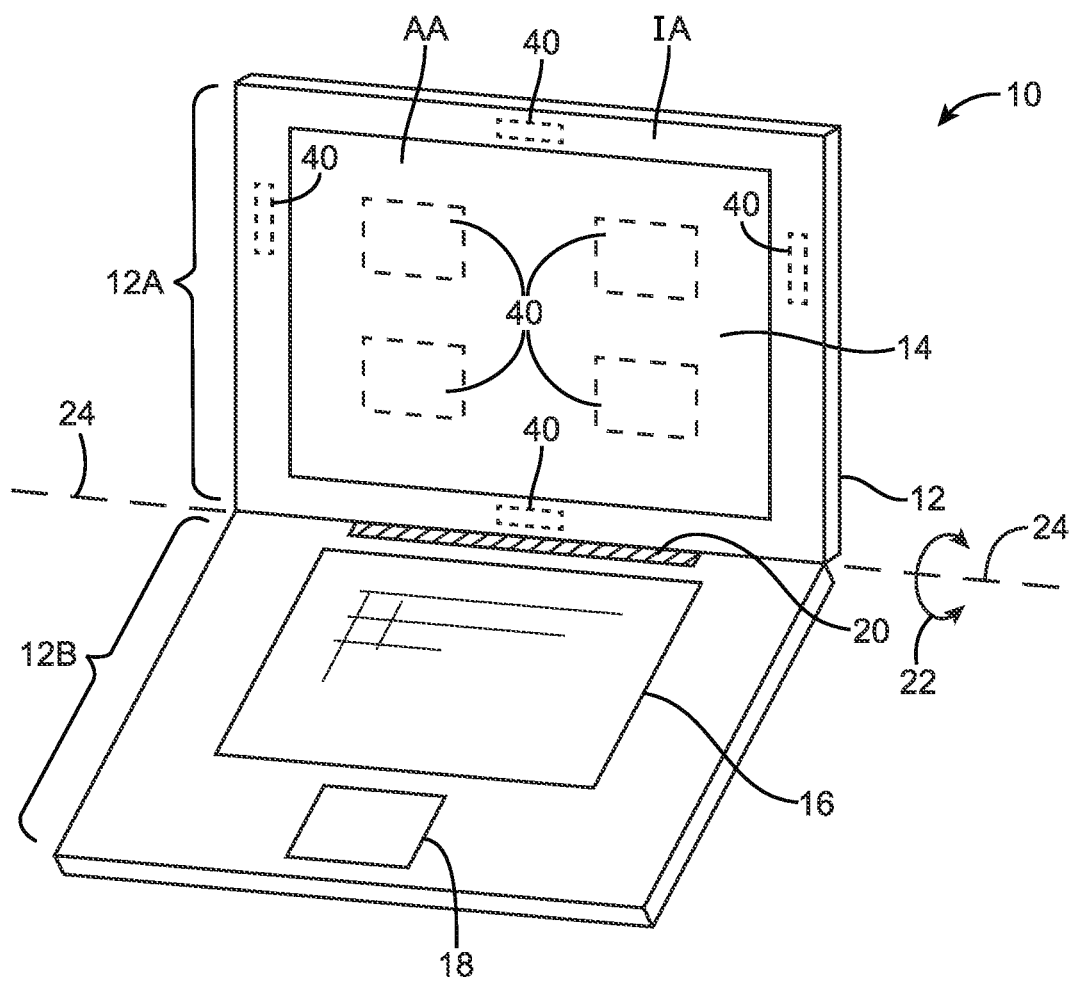
FIG. 1 is a perspective view of an illustrative electronic device such as a laptop computer with a light sensor that receives light through a display in accordance with an embodiment.

Electronic device 10 of FIG. 1 has the shape of a laptop computer and has upper housing 12A and lower housing 12B with components such as keyboard 16 and touchpad 18. Device 10 has hinge structures 20 to allow upper housing 12A to rotate in directions 22 about rotational axis 24 relative to lower housing 12B. Display 14 such as an enhanced translucency display is mounted in upper housing 12A. Upper housing 12A, which may sometimes be referred to as a display housing or lid, is placed in a closed position by rotating upper housing 12A towards lower housing 12B about rotational axis 24. Light sensors 40 such as ambient light sensors are mounted behind a portion of display 14. Light sensors 40 may be ambient light sensors, proximity sensors, ultraviolet light sensors, infrared light sensors, thin-film solar cells, photoplethysmograph (PPG) sensors, or other light sensor that sense the amount of light falling on the light sensor through the translucent display 14. Each light sensor 40 may include one or more photosensitive elements such as one or more photodiodes that generate electrical signals in response to incident light. Light sensors that are implemented as proximity sensors may also include a light-emitting component such as a light-emitting diode that emits light through a translucency enhancement feature and/or a light-guiding layer of the display.

Figure 2:
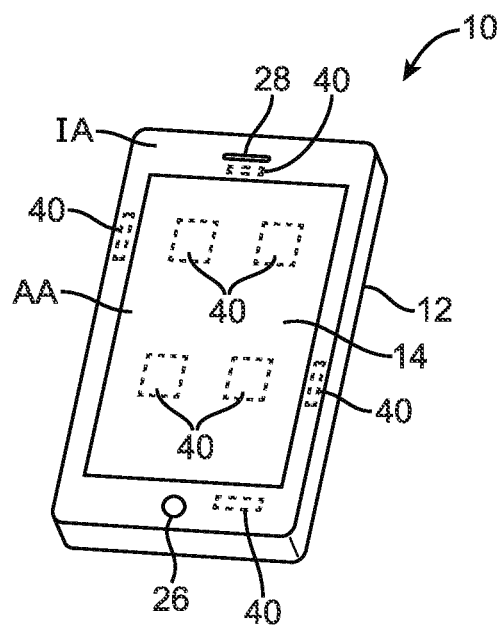
FIG. 2 is a perspective view of an illustrative electronic device such as a handheld electronic device with a light sensor that receives light through a display in accordance with an embodiment.

FIG. 2 shows an illustrative configuration for electronic device 10 in which device 10 is implemented as a handheld device such as a cellular telephone, music player, gaming device, navigation unit, or other compact device. In this type of configuration for device 10, housing 12 has opposing front and rear surfaces. Display 14 is mounted on a front face of housing 12. Display 14 may have an exterior layer such as a rigid transparent layer that includes openings for components such as button 26 and speaker port 28.

Figure 3:
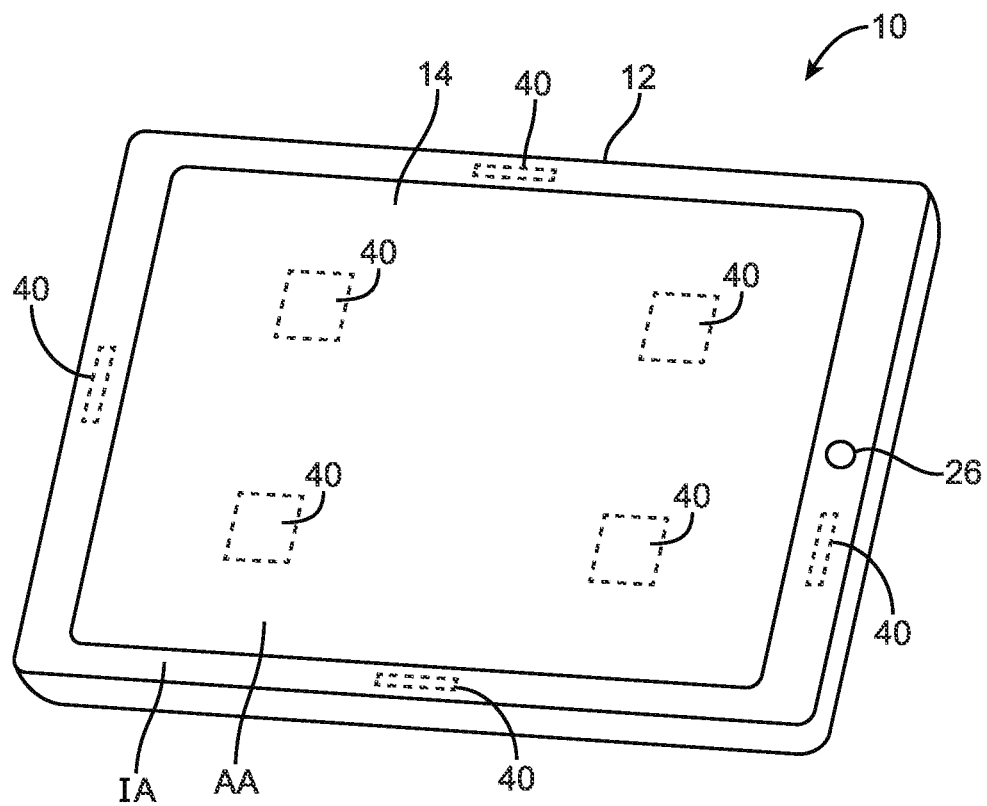
FIG. 3 is a perspective view of an illustrative electronic device such as a tablet computer with a light sensor that receives light through a display in accordance with an embodiment.

In the example of FIG. 3, electronic device 10 is a tablet computer. In electronic device 10 of FIG. 3, housing 12 has opposing planar front and rear surfaces. Display 14 is mounted on the front surface of housing 12. As shown in FIG. 3, display 14 has an external layer with an opening to accommodate button 26.

Figure 4:
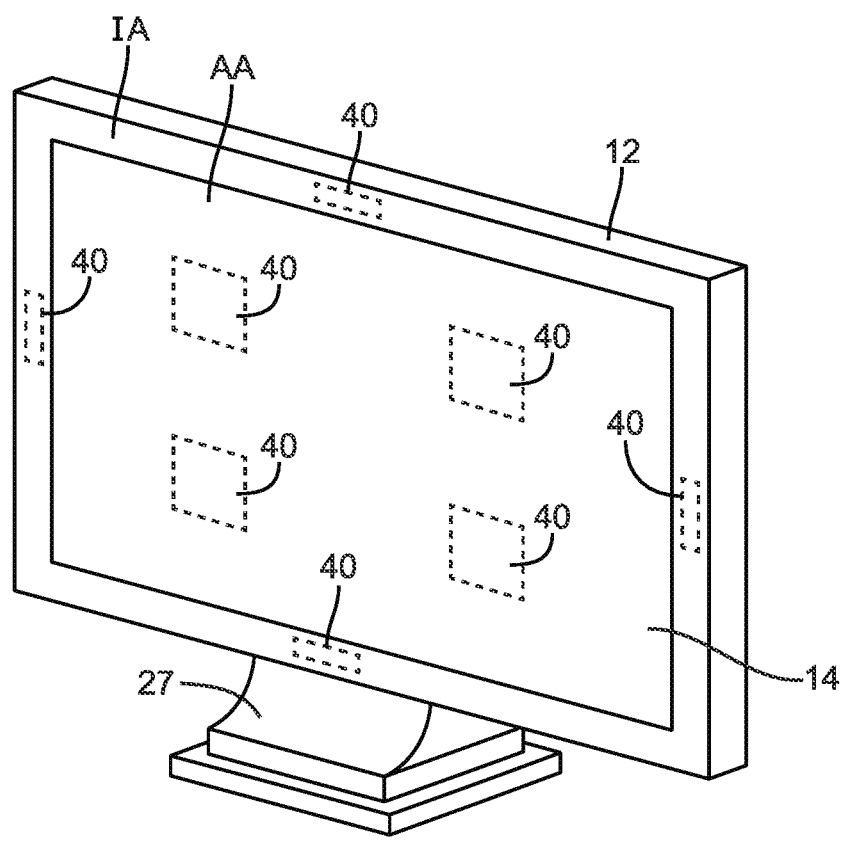
FIG. 4 is a perspective view of an illustrative electronic device such as a computer display with a light sensor that receives light through a display in accordance with an embodiment.

FIG. 4 shows an illustrative configuration for electronic device 10 in which device 10 is a computer display or a computer that has been integrated into a computer display. With this type of arrangement, housing 12 for device 10 is mounted on a support structure such as stand 27. Display 14 is mounted on a front face of housing 12.

In some configurations, peripheral portions of display 14 are provided with a partially or completely opaque masking layer. As shown in FIGS. 1, 2, 3, and 4, display 14 may be characterized by a central active region such as active region AA in which an array of display pixels is used in displaying information for a user. An inactive region such as inactive border region IA surrounds active region AA. In the examples of FIGS. 1, 2, 3, and 4, active region AA has a rectangular shape. Inactive region IA has a rectangular ring shape that surrounds active region AA (as an example). Portions of display 14 in inactive region IA may be covered with a partially opaque masking material such as a layer of black ink (e.g., a polymer filled with carbon black) or a layer of partially opaque metal. The masking layer helps hide components in the interior of device 10 in inactive region IA from view by a user.

In the examples of FIGS. 1, 2, 3, and 4, four light sensors 40 are mounted behind portions of display 14 in active area AA and four additional ambient light sensors 40 are mounted behind portions of display 14 in inactive area IA. However, this is merely illustrative. If desired, device 10 may include more than four light sensors 40 in active area AA, less than four light sensors 40 in active area AA, more than four light sensors 40 in inactive area IA, less than four light sensors 40 in inactive area IA, a light sensor 40 that extends behind substantially all of active area AA, behind substantially all of inactive area IA, or behind substantially all of active area AA and inactive area AA.

Light sensors 40 that are located in inactive area IA may be mounted alongside an edge of display 14. A light-guiding layer in display 14 may guide light from outside of device 10 to the light sensor mounted along the edge of the display. In this way, a light sensor is provided that can be mounted separately from an outer transparent layer of a device (i.e., a light sensor can be formed in the interior of the device). However, this is merely illustrative. If desired, light sensors 40 may be mounted directly behind display 14 in active area AA.

Display 14 includes translucency enhancement features that allow light to pass through display 14 onto the light sensor 40 that is mounted directly behind the display.

The configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wristwatch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, is formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch-sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Displays for device 10 may, in general, include image pixels formed from light-emitting diodes (LEDs), organic LEDs (OLEDs), plasma cells, electrowetting pixels, electrophoretic pixels, liquid crystal display (LCD) components, or other suitable image pixel structures. In some situations, it may be desirable to use OLED components to form display 14, so configurations for display 14 in which display 14 is an organic light-emitting diode display are sometimes described herein as an example. Other types of display technology may be used in device 10, if desired.

Figure 5:
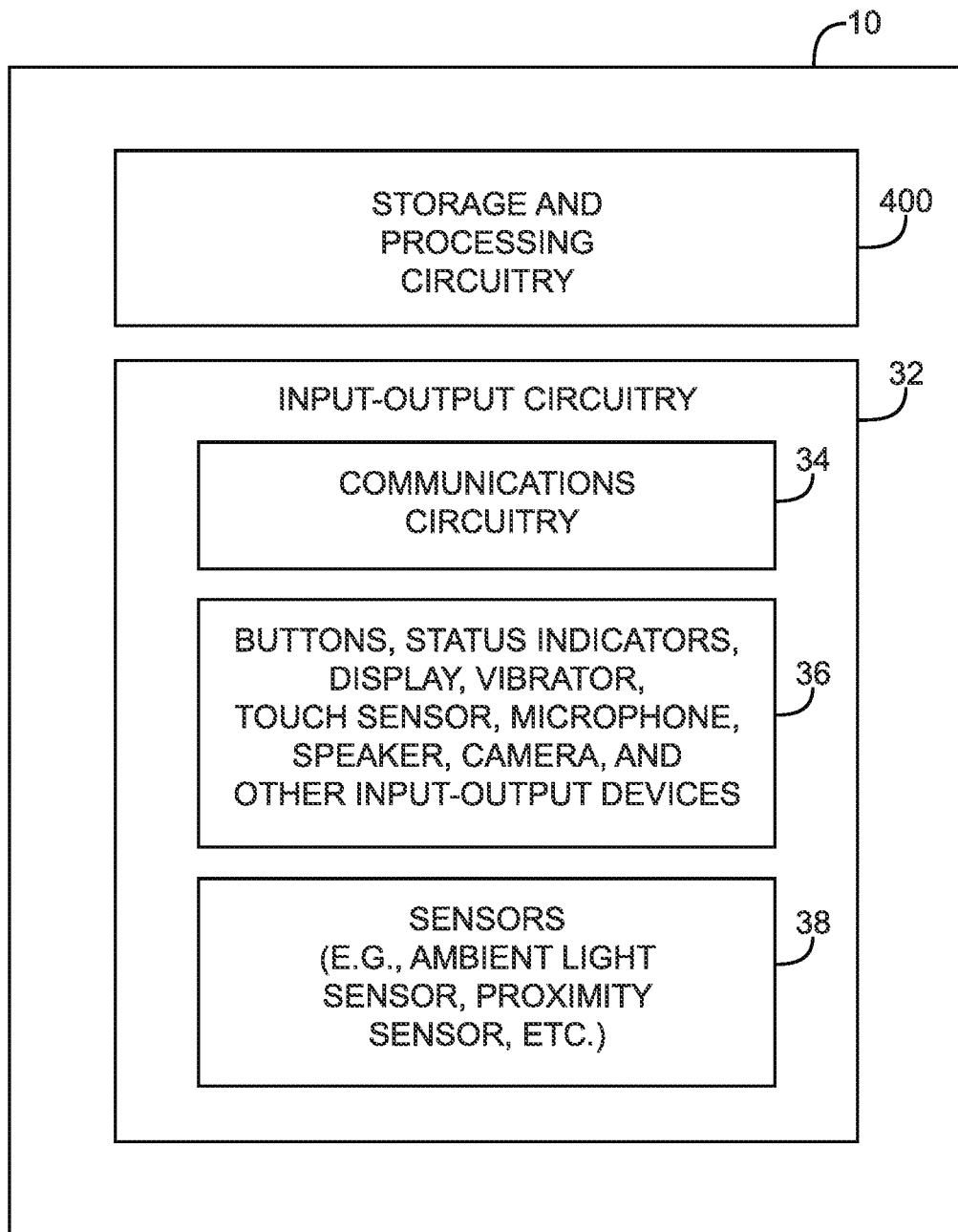
FIG. 5 is a schematic diagram of an illustrative electronic device with a light sensor and a display in accordance with an embodiment.

A schematic diagram of device 10 is shown in FIG. 5. As shown in FIG. 5, electronic device 10 includes control circuitry such as storage and processing circuitry 400. Storage and processing circuitry 400 includes one or more different types of storage such as hard disk drive storage, nonvolatile memory (e.g., flash memory or other electrically-programmable-read-only memory), volatile memory (e.g., static or dynamic random-access-memory), etc. Processing circuitry in storage and processing circuitry 400 is used in controlling the operation of device 10. The processing circuitry may be based on a processor such as a microprocessor and other integrated circuits.

With one suitable arrangement, storage and processing circuitry 400 is used to run software on device 10 such as internet browsing applications, email applications, media playback applications, operating system functions, software for capturing and processing images, software for implementing functions associated with gathering and processing sensor data, etc.

Input-output circuitry 32 is used to allow data to be supplied to device 10 and to allow data to be provided from device 10 to external devices.

Input-output circuitry 32 can include wired and wireless communications circuitry 34. Communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Input-output circuitry 32 of FIG. 5 includes input-output devices 36 such as buttons, joysticks, click wheels, scrolling wheels, a touch screen such as translucent display 14, other touch sensors such as track pads or touch-sensor-based buttons, vibrators, audio components such as microphones and speakers, image capture devices such as a camera module having an image sensor and a corresponding lens system, keyboards, status-indicator lights, tone generators, key pads, and other equipment for gathering input from a user or other external source and/or generating output for a user.

Sensors 38 of FIG. 5 include a light sensor such as an ambient light sensor for gathering information on ambient light levels. Sensors 38 also include other light sensor components such as proximity sensor components. Proximity sensor components in device 10 can include capacitive proximity sensor components, infrared-light-based proximity sensor components, proximity sensor components based on acoustic signaling schemes, solar cell light sensor technology, or other proximity sensor equipment. Sensors 38 may also include a pressure sensor, a temperature sensor, an accelerometer, a gyroscope, and other circuitry for making measurements of the environment surrounding device 10.

It can be challenging to mount electrical components such as the components of FIG. 5 within an electronic device. To facilitate mounting of components in housing 12 of device 10, sensors 38 may be configured to receive light through a portion of a display having translucency enhancement features and/or light-guiding features that increase the amount of light that passes through the display onto the light sensor.

Storage and processing circuitry 400 samples voltages, electrical charges, or other electrical light sensor signals from light sensors 40 of sensors 38. Storage and processing circuitry 400 converts the sampled signals into ambient light intensities. Storage and processing circuitry 400 controls other aspects of the operation of device 10 using the converted ambient light intensities. For example, storage and processing circuitry can increase or decrease the display light from the device display based on the ambient light intensity.

Figure 6:
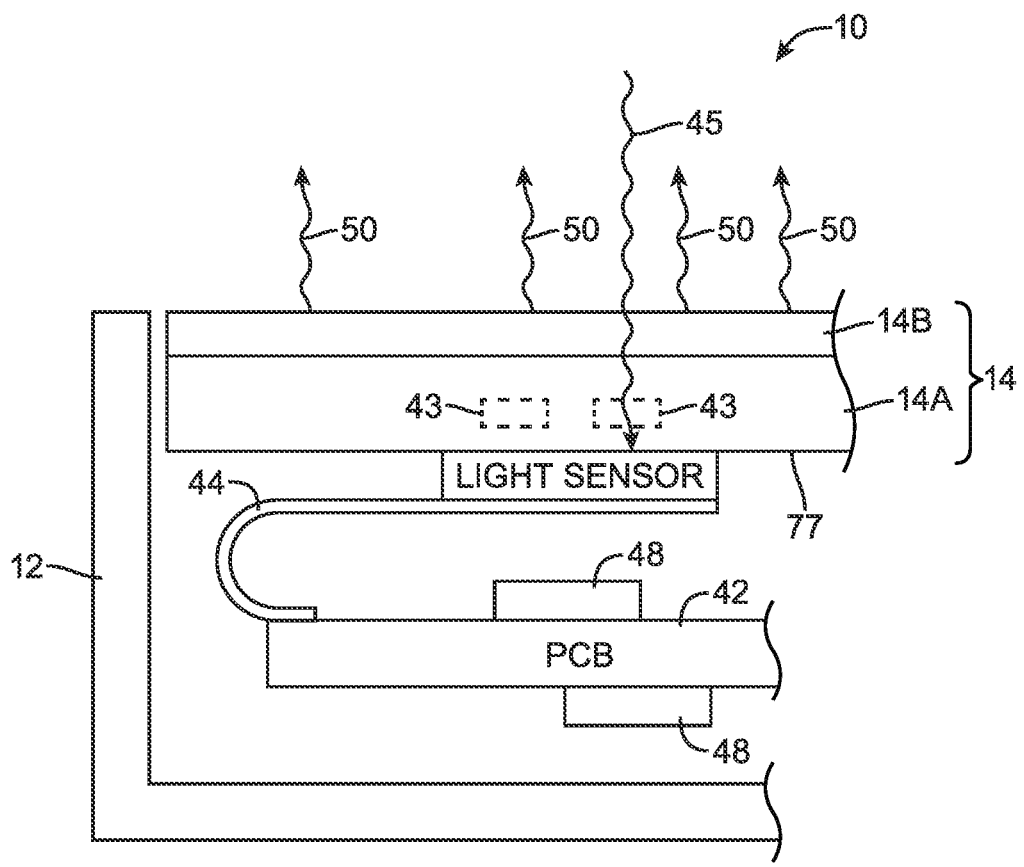
FIG. 6 is a cross-sectional side view of a portion of an illustrative electronic device having a light sensor mounted behind an enhanced translucency display in accordance with an embodiment.

FIG. 6 is a cross-sectional view of a portion of device 10 with a light sensor such as light sensor 40 that is mounted adjacent to inner surface 77 of display 14 having translucency enhancement features 43. Device 10 also includes a circuitry such as printed circuit board 42 and a flexible printed circuit 44 that electrically couples light sensor 40 to printed circuit board (PCB) 42. Circuitry associated with printed circuit board 42 (e.g., internal circuitry, circuitry on a surface of PCB 42, and/or integrated circuitry such as circuit components 48 mounted to a surface of PCB 42) controls the operation of display 14 and light sensor 40. PCB 42 and components 48 may, for example, form some or all of storage and processing circuitry 400 of FIG. 5.

Light signals such as ambient light intensity signals gathered using light sensor 40 in response to light 45 are routed to printed circuit board 42 through flexible printed circuit 44. Flexible printed circuit 44 is attached to a portion of sensor 40 using electrical coupling material (e.g., anisotropic conductive film (ACF), solder, or other electrically conductive adhesive material). An opposing end of flexible printed circuit 44 is attached to a portion of PCB 42 using electrical coupling material (e.g., anisotropic conductive film (ACF), solder, or other electrically conductive adhesive materials, or mechanical connector structures).

Display 14 may include multiple display layers such as layers 14A and 14B. Display layer 14B may include a transparent cover layer (e.g., a sheet of transparent plastic or glass) and, if desired, a touch-sensitive layer and/or other display layers such as protective films, anti-reflection coatings, anti-glare coatings, anti-smudge coatings, etc. A touch-sensitive layer may include transparent electrodes formed from, for example, indium tin oxide or other transparent or translucent conductive material. Touch-sensor circuitry may include capacitive touch-sensor technology, resistive touch-sensor technology, force-based touch-sensor technology or other touch-sensor technology for gathering user touch input.

Display layer 14A may include multiple layers for generating display images for display 14. Display layer 14A may include image generating structures such as light-emitting diodes (LEDs), organic LEDs (OLEDs), plasma cells, electrowetting pixels, electrophoretic pixels, liquid crystal display (LCD) components, backlight structures, or other suitable image pixel structures.

As shown in FIG. 6, translucency enhancement features 43 may be features of display 14 that allow light 45 from outside of device 10 to be transmitted directly through display 14 onto light sensor 40. Translucency enhancement features of this type may allow less than 1 percent, less than 0.5 percent, less than 0.2 percent, less than 0.05 percent, less than 0.02 percent, greater than 0.01 percent, greater than 0.02 percent, greater than 0.1 percent between 0.05 and 1 percent, between percent and 3 percent or less than 5 percent of light 45 to pass through features 43.

Translucency enhancement features 43 may include openings in a display layer (e.g., microperforations in a reflective layer of a display), a partially transmissive reflector layer (e.g., a reflective layer that reflects a portion of the light that is incident on it while passing a relatively smaller portion of the incident light or a reflective layer that reflects light such as display light 50 having a first set of wavelengths such as visible wavelengths while passing light of a second, different set of wavelengths such as infrared and/or ultraviolet wavelengths), or other structures that allow a relatively larger portion of incident light to pass through as compared with conventional displays.

Translucency enhancement features 43 may be formed in localized portions of display 14 as in the example of FIG. 6 or may extend across some or all of display 14. In configurations in which features 43 are formed in localized portions of display 14, a larger fraction of ambient light 45 may pass through features 43 than the fraction that passes through other portions of display 14. In configurations in which features 43 extend across substantially all of display 14, display 14 may be a translucent display that allows a measurable fraction of external light 45 to pass through the display onto a sensor such as sensor 40.

Figure 7:
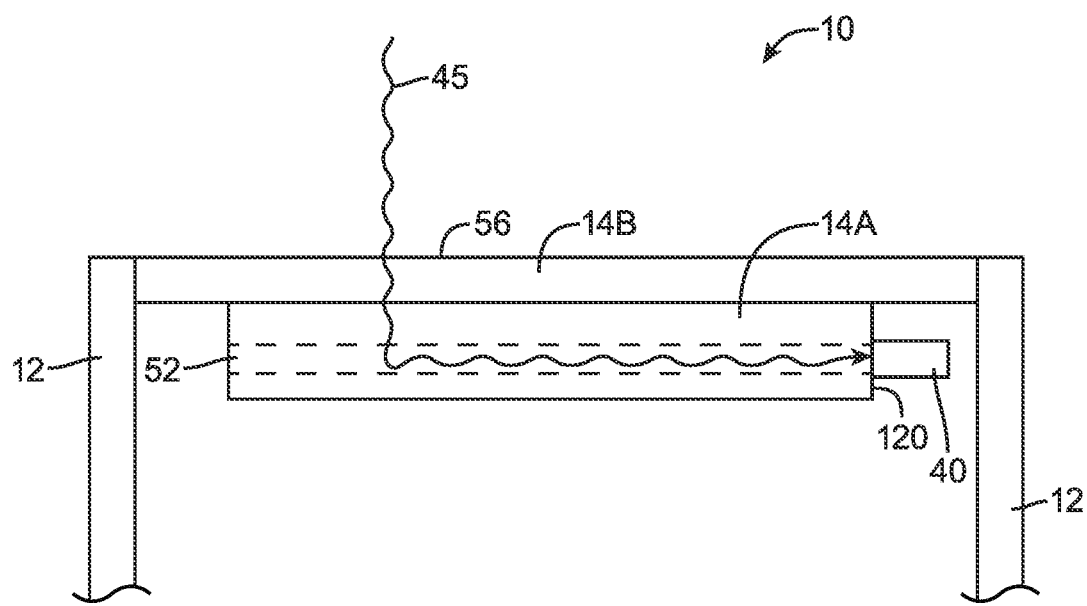
FIG. 7 is a cross-sectional side view of a portion of an illustrative electronic device having a light sensor mounted along an edge of a display that includes a light-guiding layer that guides light to the light sensor in accordance with an embodiment.

The translucency enhancement features of FIG. 6 are merely illustrative. As shown in FIG. 7, display 14 may be provided with one or more light-guiding structures such as light-guiding layer 52 of display 14 that guide light through at least a portion of the display to a light sensor such as light sensor 40. In the example of FIG. 7, light sensor 40 is mounted adjacent to edge 120 of display layers 14A. In this type of configuration, light 45 enters display 14 through outer surface 56 and is redirected along layer 52 onto sensor 40. Light-guiding layer 52 may include wave-guide structures, light-focusing structures, optical films such as wave-guide films or film stacks that redirect light based on reflections at refractive index changes between films in the stack, beam steering films, geometric light-guiding structures, corrugated light-guiding structures, or other light-guiding structures.

As examples, layer 52 may include a first planar layer of transparent material and a curved layer of transparent material attached to the planar layer that guides light in a direction parallel to the planar layer or layer 52 may include a pair of transparent layers having planar outer surfaces and interfacing corrugated interior surfaces that guide light in a direction parallel to the planar outer surfaces using reflections at the interfacing corrugated interior surfaces.

Figure 12:
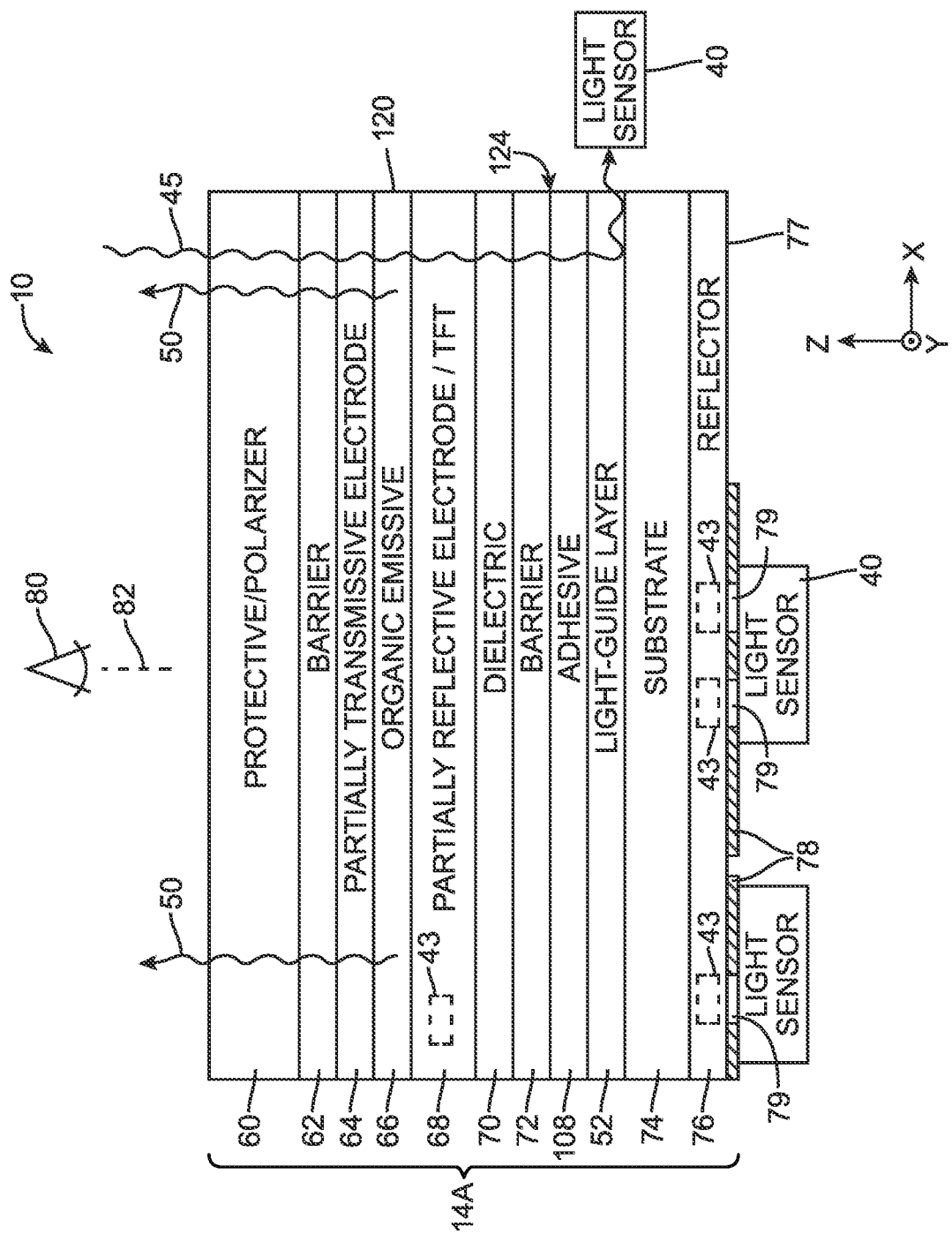
FIG. 12 is a diagram of an illustrative top-emission organic light-emitting diode display having a light-guiding layer that guides light onto a light sensor mounted along an edge of the display in accordance with an embodiment.
Figure 13:
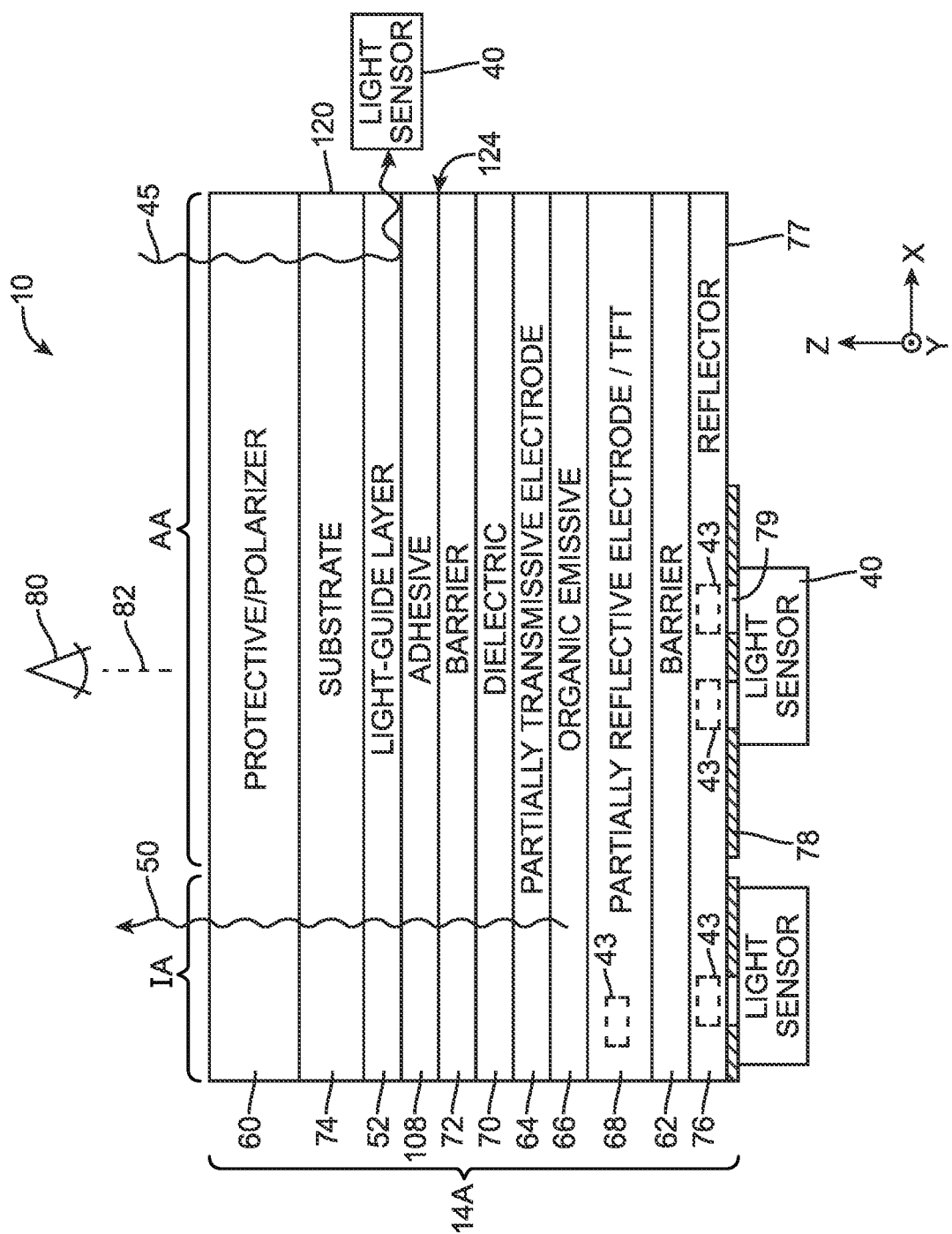
FIG. 13 is a diagram of an illustrative bottom-emission organic light-emitting diode display having a light-guiding layer that guides light onto a light sensor mounted along an edge of the display in accordance with an embodiment.
Figure 14:
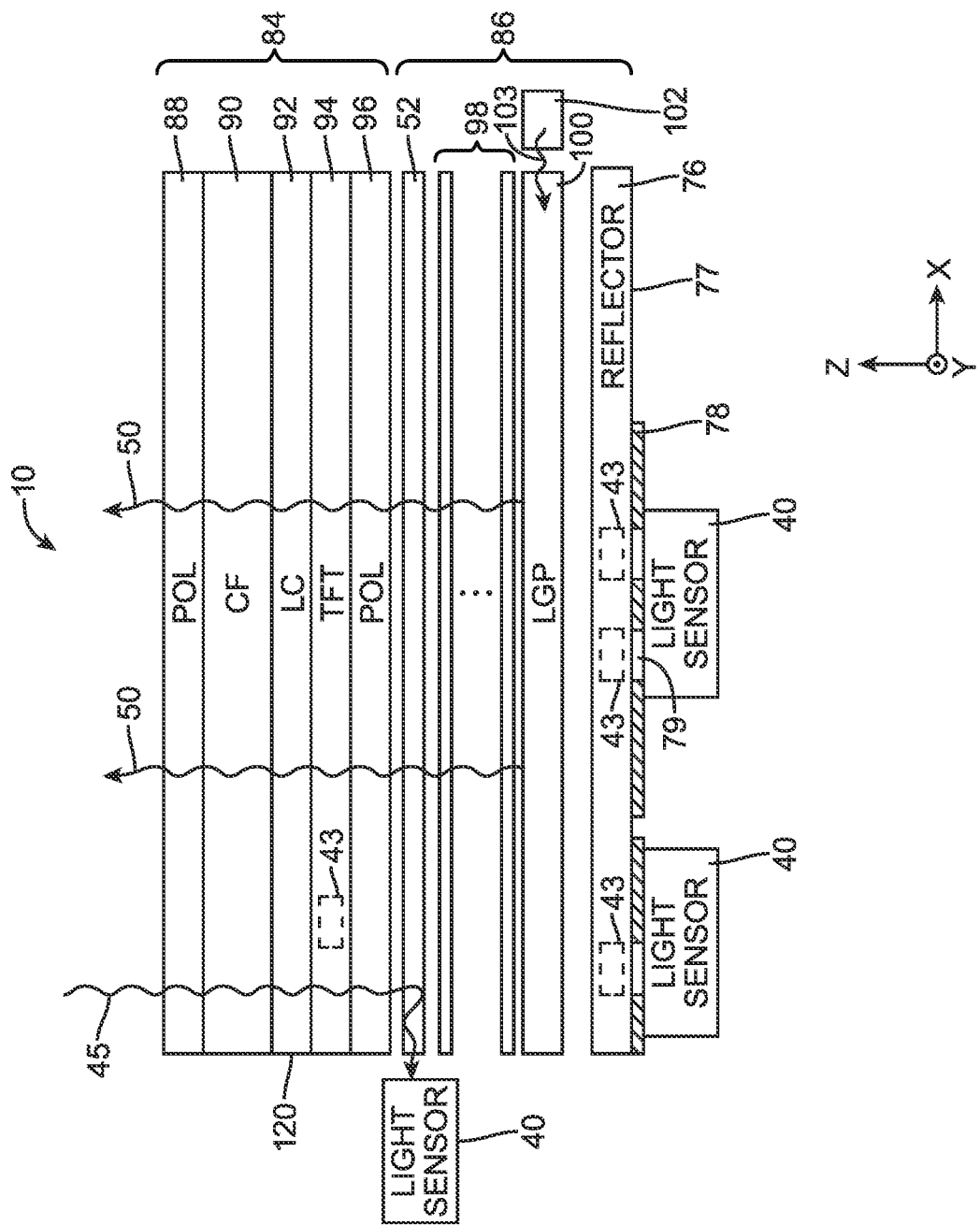
FIG. 14 is a diagram of an illustrative liquid crystal display having a light-guiding layer that guides light onto a light sensor mounted along an edge of the display in accordance with an embodiment.

FIGS. 8, 9, 10, and 11 show examples of arrangements in which display 14 includes translucency enhancement features that allow light from outside of device 10 to be transmitted directly through display 14 onto a light sensor. FIGS. 12, 13, and 14 show examples of arrangements in which display 14 includes a light-guiding layer that guides light through the display to a light sensor that mounted adjacent the display.

Figure 8:
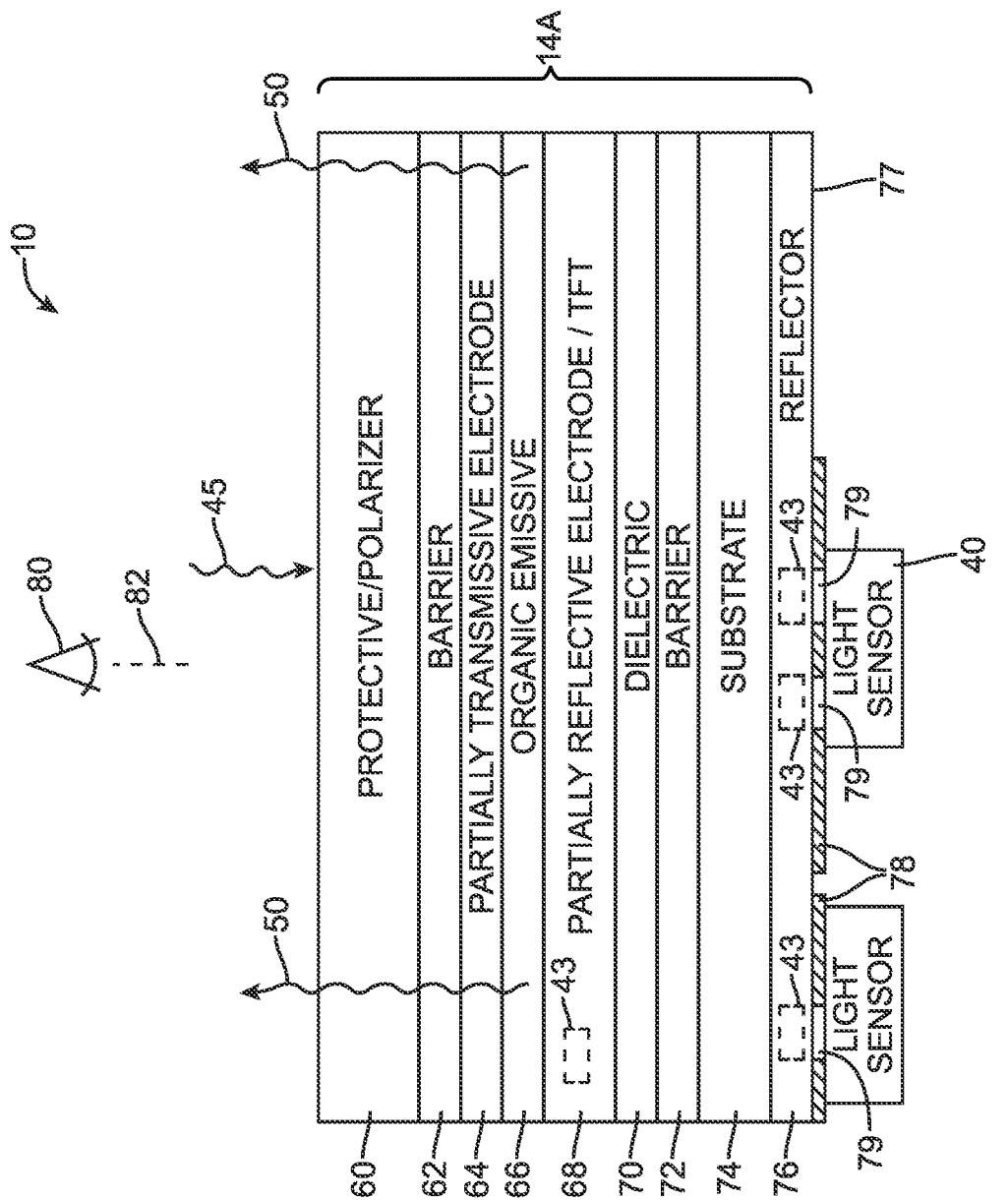
FIG. 8 is a diagram of an illustrative top-emission organic light-emitting diode display having translucency enhancement features that allow light to pass through the display onto a light sensor in accordance with an embodiment.
Figure 9:
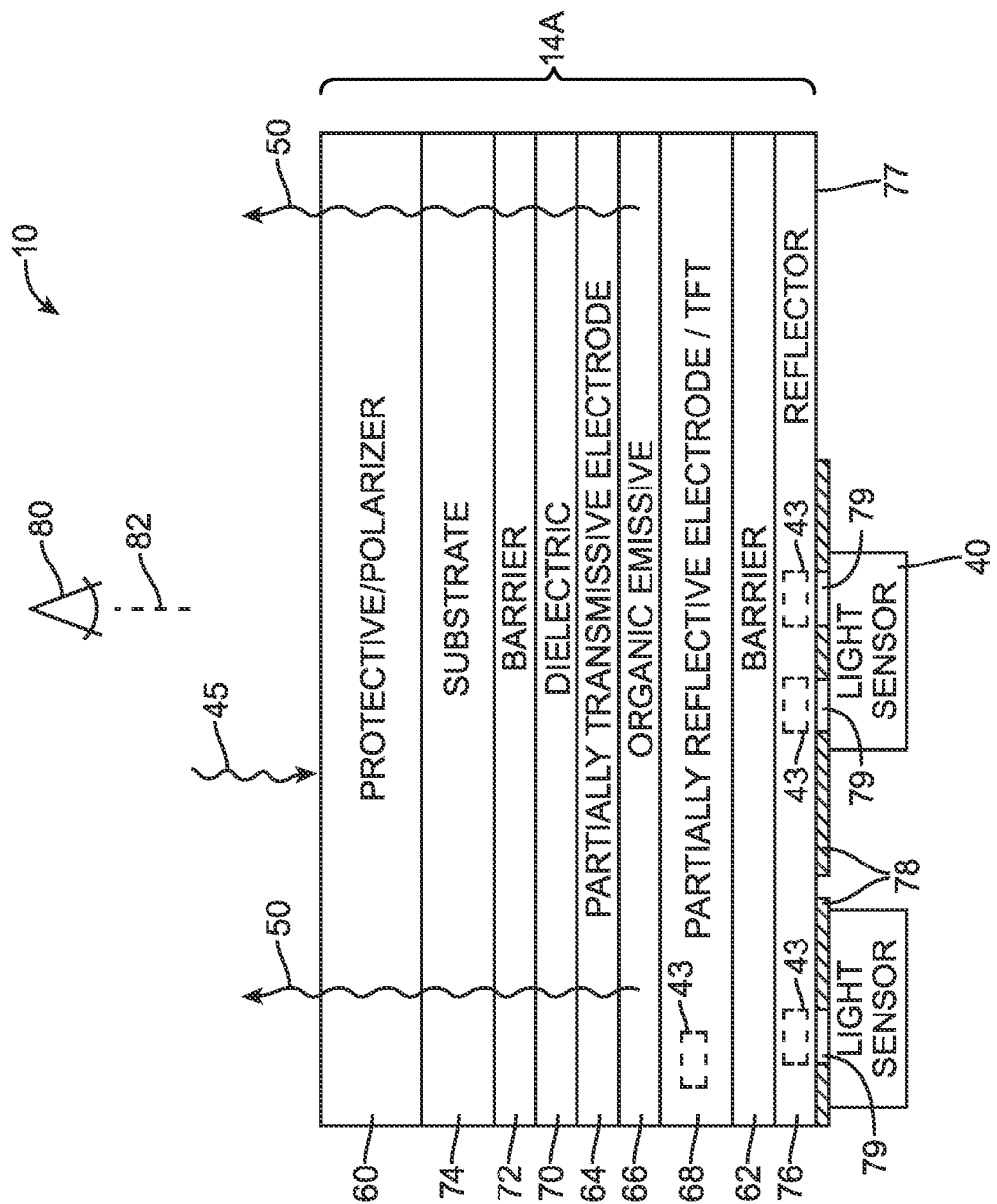
FIG. 9 is a diagram of an illustrative bottom-emission organic light-emitting diode display having translucency enhancement features that allow light to pass through the display onto a light sensor in accordance with an embodiment.
Figure 10:
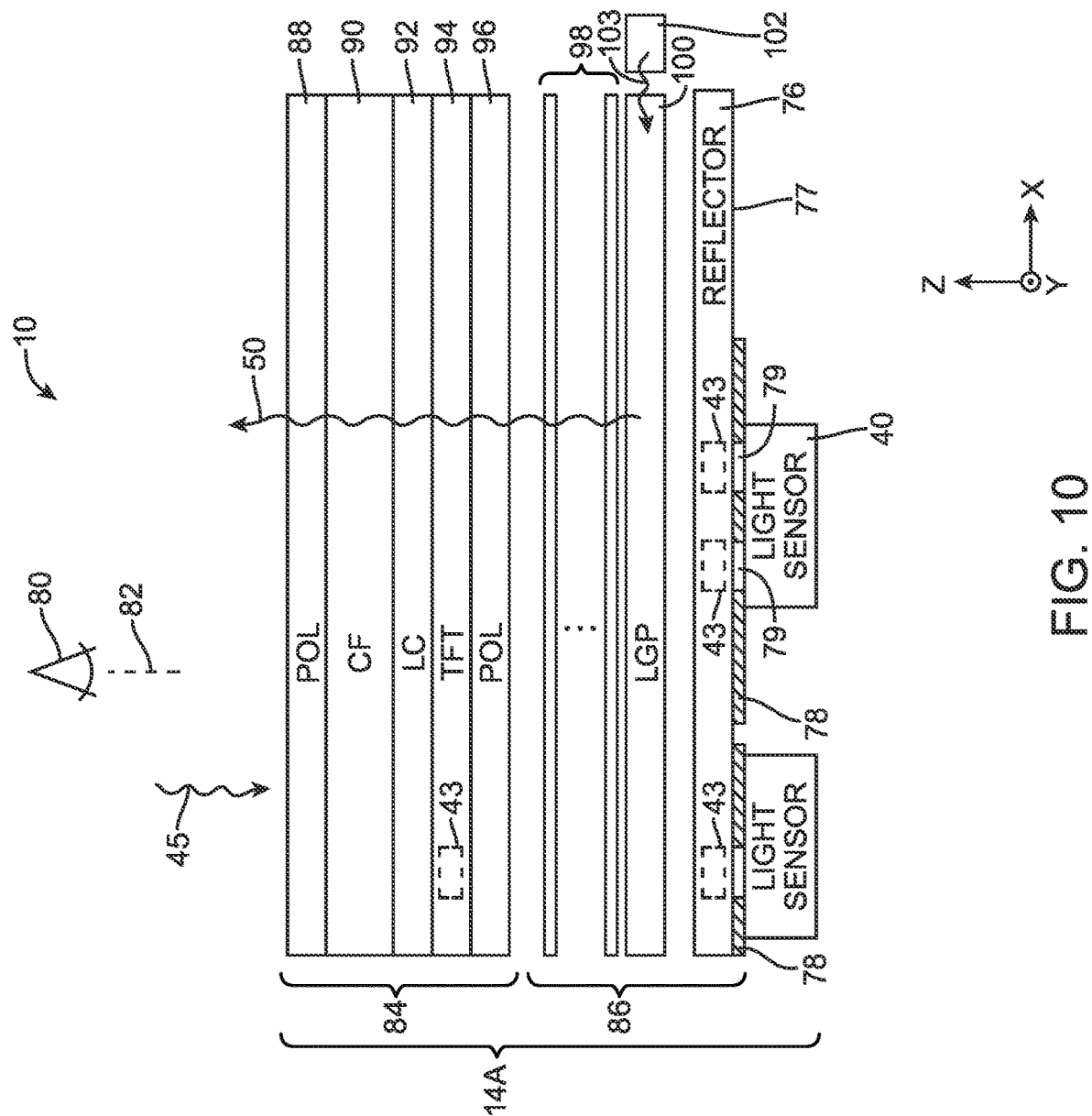
FIG. 10 is a diagram of an illustrative liquid crystal display having translucency enhancement features that allow light to pass through the display onto a light sensor in accordance with an embodiment.

FIG. 8 is a cross-sectional view of a light sensor 40 that receives light 45 through display layers 14A that are implemented as a top-emission organic light emitting diode (OLED) display. FIG. 9 is a cross-sectional view of a light sensor 40 that that receives light 45 through display layers 14A that are implemented as a bottom-emission organic light emitting diode (OLED) display. FIG. 10 is a cross-sectional view of a light sensor 40 that that receives light 45 through display layers 14A that are implemented as a liquid crystal display (LCD).

In a configuration for display 14 of the type shown in FIG. 8, layers 14A include an outer layer such as layer 60. Outer layer 60 may include a protective film and/or one or more light-polarizing layers such as a linear polarizer and/or a circular polarizer. Layers 14A include a layer of organic light-emitting material such as organic emissive layer 66 that is interposed between electrode layers 64 and 68. Electrode layer 64 may be a partially transmissive electrode layer such as a cathode layer that allows display light 50 to pass through the electrodes.

Organic emissive layer 66 may be formed from organic plastics such as polyfluorene or other organic emissive materials. Electrode layer 64 is covered by barrier layer 62. Barrier layer 62 may be formed from a layer of plastic, a glass layer, a thin-film encapsulation layer formed from a material such as silicon nitride, a layered stack of alternating polymer and ceramic materials, or other suitable material for forming a barrier layer that protects organic emissive layer 66 from environmental exposure by preventing water and oxygen from reaching organic emissive materials within layer 66.

Electrode layer 68 may be a reflective or partially reflective electrode layer such an anode layer. An array of thin-film transistors (TFTs) may be formed throughout some or all of layer 68. The thin-film transistors may be formed from semiconductors such as amorphous silicon, polysilicon, or compound semiconductors (as examples). Layer 68 may include reflective material or opaque masking material (e.g., black ink) on thin film-transistors in layer 68 that helps prevent the thin-film transistors from being viewed by a viewer such as viewer 80 viewing display 14 in direction 82. If desired, a layer of transparent dielectric material such as dielectric layer 70 may be formed on a surface of electrode layer 68. Dielectric layer 70 may help planarize the surface of electrode layer 68 or may be a dielectric spacer layer for display 14. However, this is merely illustrative. If desired, display layer 14A may be formed without dielectric layer 70.

An additional barrier layer such as barrier layer 72 is formed over electrode layer 68 and dielectric layer 70. In configurations in which layers 14A are provided without dielectric layer 70, barrier layer 72 may be formed directly on electrode layer 68. Barrier layer 72 may be formed from a layer of metal foil, metal foil covered with plastic, other metal structures, a glass layer, a thin-film encapsulation layer formed from a material such as silicon nitride, a layered stack of alternating polymer and ceramic materials, or other suitable material for encapsulating organic emissive layer 66 and electrode layer 68.

Substrate layer 74 (e.g., a layer of plastic or glass) is attached to barrier layer 72. A reflective layer such as reflector 76 may be attached to substrate 74. Reflective layer 76 reflects light that is emitted from organic emissive layer 66 in the direction of reflector 76 back out of display layers 14A to be viewed by a viewer such as viewer 80.

As shown in FIG. 8, one or more light sensors 40 may be mounted adjacent to a surface such as surface 77 of reflector 76. Light 45 such as ambient light passes through translucency enhancement features 43 in display layer 14A onto light sensors 40. In the example of FIG. 8, translucency enhancement features 43 are formed in reflector layer 76 and electrode/TFT layer 68. However, this is merely illustrative. If desired, display 14 may include translucency enhancement features in any location in display 14.

Translucency enhancement features 43 in reflector layer 76 may include openings such as microperforations (i.e., perforations that allow light to pass through but that are too small to be seen with the human eye when no light shines through the perforations) or regions of modified transparency in reflector layer 76. For example, translucency enhancement features 43 may be portions of reflector 76 that are formed form translucent material that reflects a portion of the light that is incident on it while passing a relatively smaller portion of the incident light or features 43 may be portions of reflector 76 that are formed from a material that reflects light such as display light 50 having a first set of wavelengths such as visible wavelengths while passing light of a second, different set of wavelengths such as infrared and/or ultraviolet wavelengths (as examples).

Translucency enhancement features 43 may be formed in localized portions of reflector 76 as in the example of FIG. 8 or may extend across some or all of reflector 76 (e.g., reflector 76 may be substantially all formed from a material that is partially translucent or that allows light having a given range of wavelengths such as infrared wavelengths and/or ultraviolet wavelengths to pass while reflecting light of other wavelengths).

Translucency enhancement features in electrode/TFT layer 68 may include microperforations in layer 68, portions of layer 68 that are formed from a translucent material, portions of layer 68 that are formed from a material that passes light having a given range of wavelengths (e.g., infrared wavelengths and/or ultraviolet wavelengths) while reflecting light of other wavelengths, or may include portions of opaque conductive structures such as conductive traces that are modified to allow light to pass through or between the conductive traces. Modified conductive traces may include locally thinned conductive traces or rerouted conductive traces (as examples). As shown in FIG. 8, features 43 in layer 68 may be aligned with features 43 in layer 76 so that light such as light 45 may pass through the aligned translucency enhancement features in multiple display layers onto one or more of light sensors 40.

Light absorbing material 78 is formed on surface 77 of reflector 76. Light absorbing material may include light-absorbing ink such as infrared absorbing ink that prevents light from reflecting from sensors 40 back through display layers 14A. Material 78 on surface 77 helps prevent user 80 from viewing light sensor 40. Material 78 may include one or more openings 79 aligned with features 43 that allow light to pass through the openings onto sensors 40.

In a configuration for display 14 of the type shown in FIG. 9, light sensors 40 receive light 45 through translucency enhancement features 43 in a bottom-emission light emitting diode display (i.e., an OLED display that emits light through a substrate layer). In the example of FIG. 9, a first surface of substrate layer 74 is attached to outer layer 60 and a second, opposing surface of substrate 74 is attached to barrier layer 72. Optional dielectric layer 70 is attached to barrier layer 72 and electrode layer 64 is attached to dielectric layer 70. In configurations in which display layers 14A are provided without dielectric layer 70, barrier layer 72 may be formed directly on electrode layer 64. Organic emissive layer 66 is sandwiched between electrode layers 64 and 68 and emits display light 50 through electrode layer 64 and other display layers 14A. Barrier layer 62 is formed on electrode layer 68 and reflector layer 76 is attached to barrier layer 62.

One or more light sensors 40 is mounted adjacent to surface 77 of reflector 76 and receives light such as light 45 through translucency enhancement features 43 in reflector layer 76, electrode layer 68, and/or other layers of display layers 14A.

In a configuration for display 14 of the type shown in FIG. 10, light sensors 40 receive light 45 through translucency enhancement features 43 in a liquid crystal display (LCD) formed from liquid crystal display cell 84 and backlight structures 86. Liquid crystal layer 92 of LCD cell 84 is formed between color filter layer 90 and thin-film transistor layer 94. Layers 90 and 94 may be formed on a transparent substrate such as a sheet of glass. Liquid crystal layer 92, color filter layer 90, and thin-film transistor layer 94 are sandwiched between light polarizing layers such as upper polarizer 88 and lower polarizer 96.

Backlight structures 86 may include a light guide plate such as light guide plate 100. Light guide plate 100 may be formed from a transparent material such as clear glass or plastic that guides light using internal reflections within plate 100. During operation of backlight structures 86, a light source such as light source 102 may generate light 103. Light source 102 may be, for example, an array of light-emitting diodes.

Light 103 from light source 102 may be coupled into an edge of light guide plate 100 and may be distributed in dimensions X and Y throughout light guide plate 100 due to the principal of total internal reflection. Light guide plate 100 may include light-scattering features such as pits or bumps. The light-scattering features may be located on an upper surface and/or on an opposing lower surface of light guide plate 100.

Light 103 that scatters upwards in direction Z from light guide plate 100 may serve as display light 50 for display 14. Light 103 that scatters downwards may be reflected back in the upwards direction by reflector 76. Reflector 76 may be formed from a reflective material such as metal, a layer of white plastic or may be formed from a translucent material that allows some of light 45 to pass while reflecting other portions of light 45.

Backlight structures 86 may include optical films 98 (e.g., diffuser layers, compensation films for enhancing off-axis viewing, and brightness enhancement films (also sometimes referred to as turning films) for collimating backlight).

Light sensor 40 may be attached to interior surface 77 of a reflector such as reflector 76 that is implemented in backlight unit 86 and may receive ambient light through upper polarizer 88, color filter layer 90, liquid crystal layer 92, thin-film transistor layer 94, lower polarizer layer 96, and backlight unit 86. Backlight unit 86, thin-film transistor layer 94 and/or other portions of a liquid crystal display of the type shown in FIG. 10 may include features 43 that enhance the transmission of light 45 through display layers 14A to sensor 40.

As described above in connection with FIG. 8, translucency enhancement features 43 in reflector layer 76 may include openings such as microperforations (i.e., perforations that allow light to pass through but that are too small to be seen with the human eye when light does not shine through the perforations) or regions of modified transparency in reflector layer 76.

Translucency enhancement features 43 may be formed in localized portions of reflector 76 or may extend across some or all of reflector 76.

Translucency enhancement features 43 in thin-film transistor layer 94 may include microperforations in layer 94, partially translucent portions of layer 94, portions of layer 94 that pass light having a given range of wavelengths (e.g., infrared and/or ultraviolet wavelengths) while reflecting light of other wavelengths (e.g., visible wavelengths), or may include portions of opaque conductive structures such as conductive traces that are modified to allow light to pass through the conductive traces. Modified conductive traces may include locally thinned conductive traces or rerouted conductive traces (as examples). Features 43 in layer 94 may be aligned with features 43 in layer 76 so that light such as light 45 may pass through the aligned translucency enhancement features onto one or more of light sensors 40.

Figure 11:
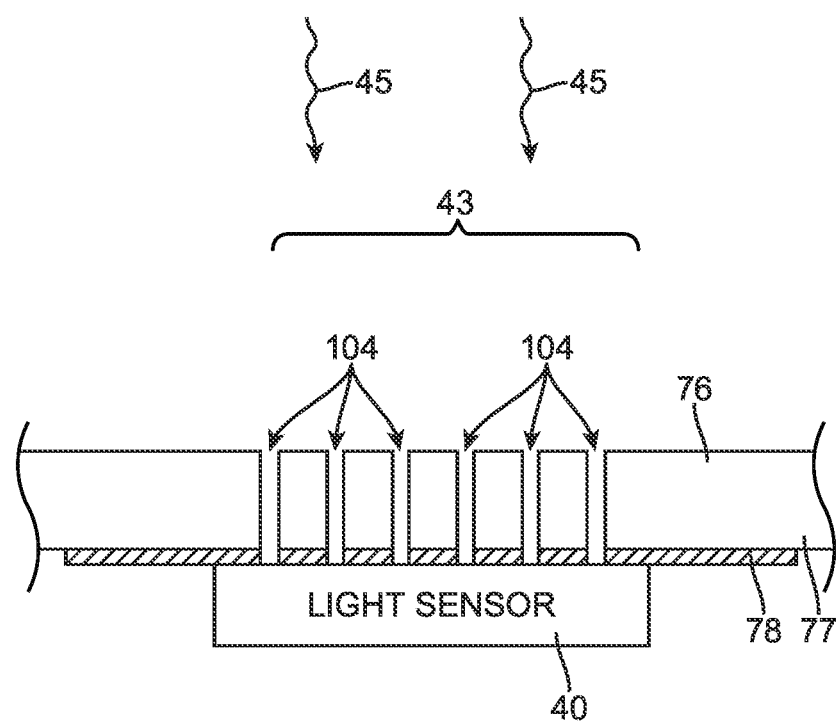
FIG. 11 is a diagram of an illustrative reflective display layer having microperforations that enhance the translucency of the reflective display layer in accordance with an embodiment.

FIG. 11 is cross-sectional view of a portion of reflector 76 showing how translucency enhancement features 43 may be formed from openings such as microperforations 104 in reflector 76. Microperforations 104 pass through reflector 76 from a first surface to an opposing second surface of reflector 76. Openings 104 may include openings in masking material 78. Microperforations 104 may be laser-drilled openings in layer 76 (as an example). If desired, microperforations such as microperforations 104 may be formed in other layers of display 14 (e.g., one or more additional display layers of display layers 14A and/or one or more of display layers 14B). Microperforations 104 may be formed in a localized portion of reflector 76 or may be formed across substantially all of reflector 76.

FIG. 12 is a cross-sectional view of a light sensor 40 that that receives light 45 through a light-guiding layer of display layers 14A that are implemented as a top-emission OLED display. FIG. 13 is a cross-sectional view of a light sensor 40 that that receives light 45 through a light-guiding layer of display layers 14A that are implemented as a bottom-emission OLED display. FIG. 14 is a cross-sectional view of a light sensor 40 that that receives light 45 through a light-guiding layer of display layers 14A that are implemented as an LCD display.

In a configuration for display 14 of the type shown in FIG. 12, a top-emission OLED display of the type shown in FIG. 8 is provided with an additional layer such as light-guide layer 52. Light-guide layer 52 is attached to barrier layer 72 using a layer of transparent adhesive such as optically clear adhesive layer 108. Substrate 74 is attached to an opposing surface of light-guide layer 52 and to reflective layer 76. Light 45 that passes through organic emissive layer 66 and enters light-guide layer 52 is guided within layer 52 (e.g., along the x-y plane of FIG. 12) onto a light sensor 40 that is mounted adjacent to edge 120 of display layers 14A (e.g., adjacent to an edge of light-guide layer 52).

During manufacturing and assembly operations, a temporary substrate such as a plastic sheet may be attached to display layers 14A at location 124. After assembly of display layers 60, 62, 64, 66, 68, 70, and 72 on the temporary substrate, the temporary substrate may be removed and light-guide layer 52 may be attached at location 124 using adhesive 108.

In a configuration for display 14 of the type shown in FIG. 13, a bottom-emission OLED display of the type shown in FIG. 9 is provided with an additional layer such as light-guide layer 52. Light-guide layer 52 is attached to barrier layer 72 using a layer of transparent adhesive such as optically clear adhesive layer 108. Substrate 74 is attached to an opposing surface of light-guide layer 52 and to outer layer 60. Light 45 that enters light-guide layer 52 is guided within layer 52 (along the x-y plane of FIG. 13) onto a light sensor 40 that is mounted adjacent to edge 120 of display layers 14A (e.g., adjacent to an edge of light-guide layer 52). Display light 50 passes through light-guide layer 52 and out of display layers 14A to be viewed by viewer 80 in direction 82.

In a configuration for display 14 of the type shown in FIG. 14, an LCD display of the type shown in FIG. 10 is provided with an additional layer such as light-guide layer 52. Light-guide layer 52 is interposed between LCD cell 84 and backlight structures 86. However, this is merely illustrative. If desired, light-guide layer 52 may be formed behind backlight unit 86 or may be formed between two other layers of LCD cell 84 or backlight structures 86. In the example of FIG. 14, light that enters light-guide layer 52 after passing through LCD cell 84 is guided within layer 52 (e.g., along the x-y plane of FIG. 14) onto a light sensor 40 that is mounted adjacent to edge 120 of display layers 14A (e.g., adjacent to an edge of light-guide layer 52). Display light 50 that is generated by backlight structures 86 passes through light-guide layer 52, through LCD cell 84, and out of display layers 14A to be viewed by viewer 80 in direction 82.

In the examples of FIGS. 12, 13, and 14, device 10 includes a light sensor mounted along edge 120 of display 14 that receives light through light-guide layer 52, and two light sensors mounted adjacent to interior surface 77 of display 14 that receive light through translucency enhancement features 43. However this is merely illustrative. In various other possible combinations, device 10 may be provided with a single light sensor mounted adjacent to surface 77, three or more light sensors mounted adjacent to surface 77 or no light sensors mounted adjacent to surface 77. Device 10 may include more than one light sensor mounted adjacent to edge 120 or may be provided without any light sensors mounted adjacent to edge 120.

In order to minimize the effect of display light 50 on light detection operations using light sensors 40, the light sensors may be provided with light-filtering structures such as light-filtering films that prevent display light from reaching the sensors, light sensor data may be gathered during blanking periods in which display 14 is not generating display light, or display light signals may be removed from light sensor data using software applications that access stored display light data associated with known features of the display light (e.g., known display light wavelengths, known display light intensities or known display light emission cycles).

Figure 15:
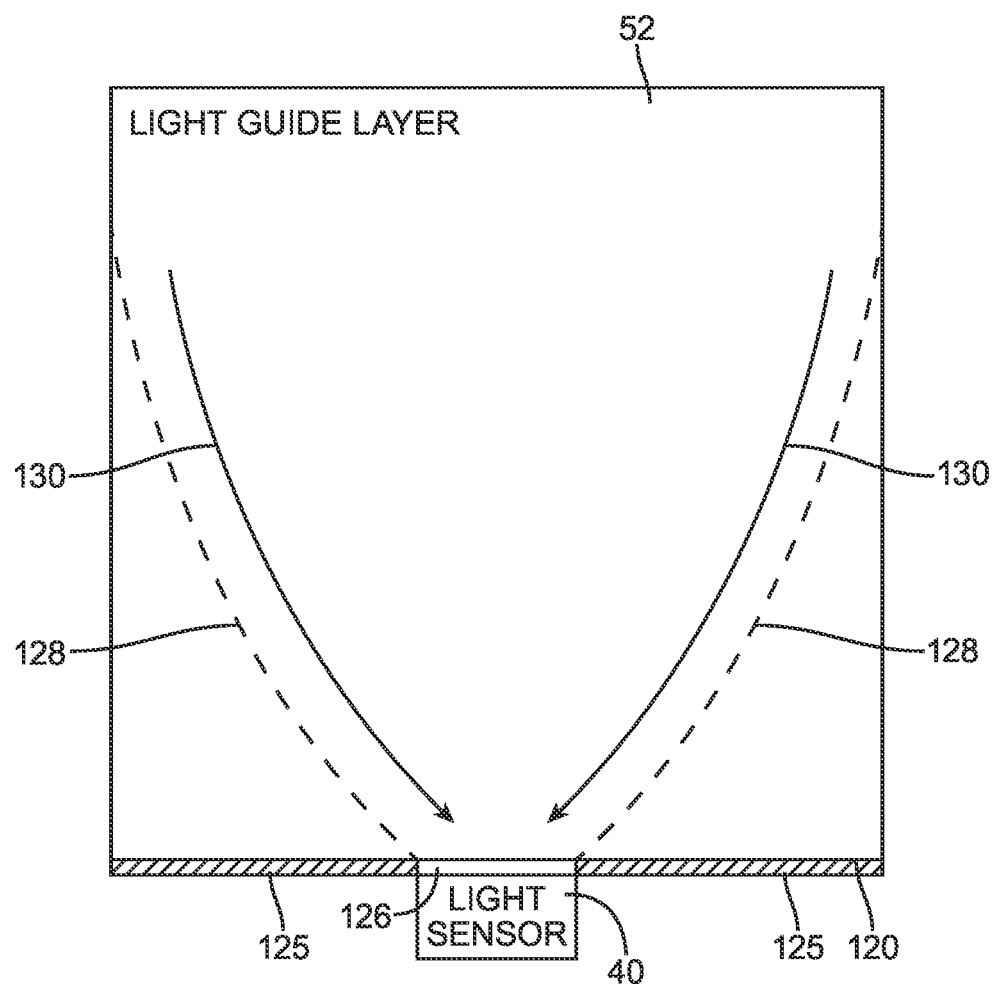
FIG. 15 is a top view of an illustrative light-guiding layer showing how the light-guiding layer may guide light onto a light sensor mounted along an edge of the light-guiding layer in accordance with an embodiment.

FIG. 15 is a top view of a light guide layer such as light-guide layer 52 (e.g., light-guide layer 52 of any of FIG.

7, 12, 13, or 14). In the example of FIG. 15, light-guide layer 52 includes internal light guiding structures 128 (e.g., geometric features, corrugated features, etc.) that guide light that is incident on light-guide layer 52 along directions 130 onto light sensor 40 mounted along edge 120. Light-guide layer 52 may include a coating layer 125 on edge 120 that prevents light from exiting light-guide layer 52. Coating 125 may have an opening such as opening 126 that allows light to exit from edge 120 through opening 126 onto light sensor 40.

Figure 16:
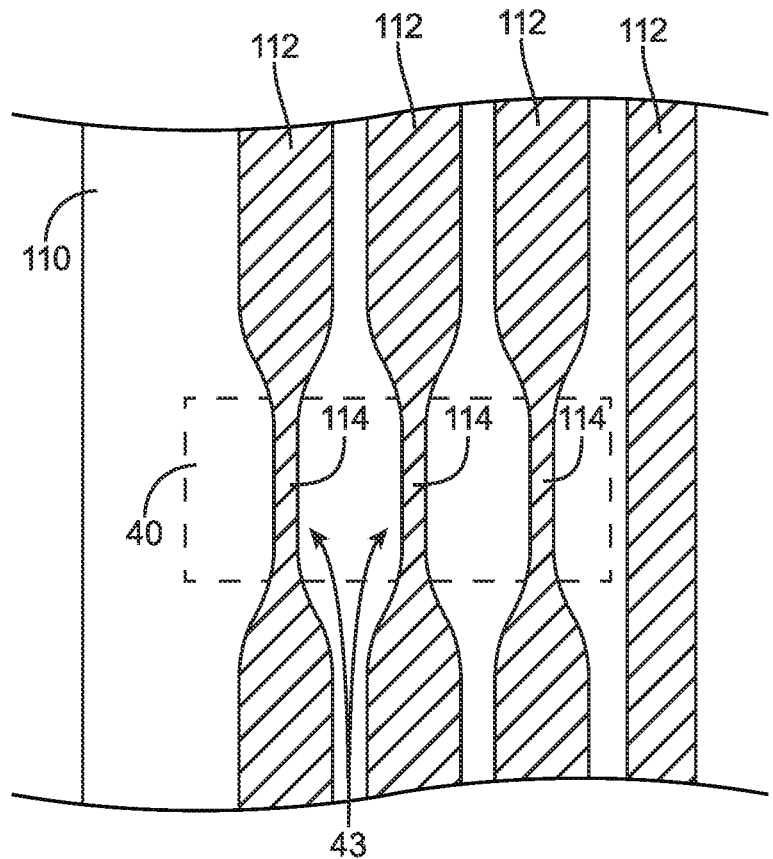
FIG. 16 is a top view of an illustrative display circuitry layer showing how translucency enhancement features may include thinned conductive traces on the display circuitry layer in accordance with an embodiment.

FIG. 16 is a top view of a portion of a display circuitry layer having translucency enhancement features formed from modified conductive traces on the circuitry layer. Display circuitry layer 110 may be a portion of electrode/TFT layer 68 of any of FIG. 8, 9, 12, or 13, may be a portion of TFT layer 94 of either of FIG. 10 or 14, or may be any other layer of display 14 having conductive traces such as traces 112. Conductive traces 112 may be formed from opaque conductive material such as metal (e.g., copper).

In the example of FIG. 16, translucency enhancement features 43 are formed from thinned portions 114 of selected conductive traces 112. Thinned portions 114 are formed over light sensor 40 so that light may pass between thinned portions 114 onto sensor 40. Layer 110 includes conductive traces 112 having thinned portions 114 and conductive traces 112 that have a substantially constant thickness along the length of the trace.

The modified conductive traces of FIG. 16 are merely illustrative. If desired, conductive traces on layer 110 may be modified in other ways to allow light to pass through conductive traces 112 onto light sensor 40.

Figure 17:
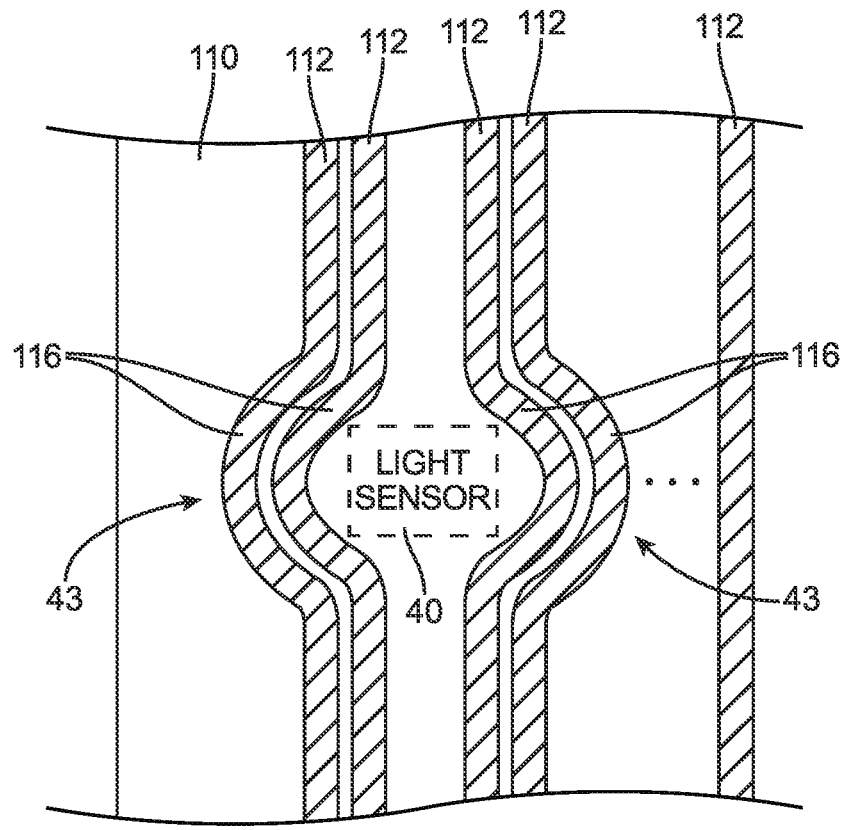
FIG. 17 is a top view of an illustrative display circuitry layer showing how translucency enhancement features may include conductive traces having curved portions that deviate from a straight path to allow light to pass through the conductive traces onto a light sensor in accordance with an embodiment.

In the example of FIG. 17, traces 112 include curved portions 116 that reroute the traces on layer 110 so that the traces avoid overlapping light sensor 40. In this way, curved portions 116 of layer 110 allow light to pass between curved portions 116 of traces 112 onto light sensor 40. Layer 110 includes conductive traces 112 having curved portions 116 and conductive traces 112 that extend along substantially straight paths on layer 110.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
a display having a cover layer, an array of pixels that displays images through the cover layer, and opaque structures; and
a light sensor mounted behind the array of pixels and configured to receive light that passes between the opaque structures of the display.

2. The electronic device defined in claim 1 wherein the opaque structures comprise opaque conductive structures.

3. The electronic device defined in claim 2 wherein the opaque conductive structures comprise metal traces.

4. The electronic device defined in claim 3 wherein the metal traces are routed around a portion of the display through which the light passes to reach the light sensor.

5. The electronic device defined in claim 3 wherein the metal traces have locally thinned portions that are thinner than other portions of the metal traces and wherein the light sensor is mounted behind the locally thinned portions.

6. The electronic device defined in claim 1 wherein the light sensor is selected from the group consisting of: an ambient light sensor, a proximity sensor, an ultraviolet light sensor, an infrared light sensor, a thin-film solar cell, and a photoplethysmograph sensor.

7. The electronic device defined in claim 1 wherein the array of pixels comprises a thin-film transistor array in an active area of the display and wherein the light sensor is mounted behind the thin-film transistor array.

8. The electronic device defined in claim 1 wherein the light sensor is overlapped by a material that reflects visible light and transmits infrared light.

9. The electronic device defined in claim 1 wherein the display has an opening through which the light passes to reach the light sensor.

10. The electronic device defined in claim 9 wherein the opening is part of an array of microperforations in the display.

11. An electronic device, comprising:
a display having an array of pixels on a substrate;
opaque conductive structures on the substrate; and
a light sensor mounted behind the array of pixels and configured to detect light that passes through a portion of the substrate that is between the opaque conductive structures.

12. The electronic device defined in claim 11 wherein the opaque conductive structures comprise metal traces having locally thinned portions that are thinner than other portions of the metal traces, and wherein the light sensor is overlapped by the locally thinned portions.

13. The electronic device defined in claim 11 wherein the opaque conductive structures comprise metal traces that are routed around the portion of the substrate through which the light passes.

14. The electronic device defined in claim 11 wherein the light sensor is one of multiple light sensors that are mounted behind the array of pixels and that receive the light through the substrate.

15. The electronic device defined in claim 11 wherein the light sensor is overlapped by a material that reflects visible light and transmits infrared light.

16. An electronic device, comprising:
a display having an array of pixels that forms an active area and having first and second opaque structures separated by a gap; and
a light sensor mounted behind the active area of the display and configured to detect light that passes through the gap.

17. The electronic device defined in claim 16 wherein the light sensor is selected from the group consisting of: an ambient light sensor, a proximity sensor, an ultraviolet light sensor, an infrared light sensor, a thin-film solar cell, and a photoplethysmograph sensor.

18. The electronic device defined in claim 16 wherein the light sensor is overlapped by a material that reflects a first range of wavelengths and transmits a second range of wavelengths that is different from the first range of wavelengths.

19. The electronic device defined in claim 16 wherein the first and second opaque structures comprise first and second metal traces.

20. The electronic device defined in claim 19 wherein the first and second metal traces have locally thinned portions that are thinner than other portions of the metal traces and wherein the light sensor is overlapped by the locally thinned portions.

* * * * *